(12) United States Patent
Kwon et al.

(10) Patent No.: US 7,534,656 B2
(45) Date of Patent: May 19, 2009

(54) IMAGE SENSOR DEVICE AND METHOD OF MANUFACTURING THE SAME

(75) Inventors: Yong-Chai Kwon, Suwon-si (KR);
Kang-Wook Lee, Suwon-si (KR);
Gu-Sung Kim, Seongnam-si (KR);
Seong-Il Han, Suwon-si (KR);
Keum-Hee Ma, Andong-si (KR);
Suk-Chae Kang, Yongin-si (KR);
Dong-Hyeon Jang, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 110 days.

(21) Appl. No.: 11/878,220

(22) Filed: Jul. 23, 2007

(65) Prior Publication Data
US 2007/0264745 A1 Nov. 15, 2007

Related U.S. Application Data

(62) Division of application No. 11/177,335, filed on Jul. 11, 2005, now Pat. No. 7,262,475.

(30) Foreign Application Priority Data
Jan. 7, 2005 (KR) ................... 2005-1684

(51) Int. Cl.
*H01L 21/00* (2006.01)
*H01L 21/44* (2006.01)
*H01L 21/48* (2006.01)
*H01L 21/50* (2006.01)
*H01L 21/46* (2006.01)
*H01L 21/78* (2006.01)
*H01L 21/301* (2006.01)

(52) U.S. Cl. .................. 438/113; 438/67; 438/116; 438/460

(58) Field of Classification Search ............... 438/67, 438/107–121, 460
See application file for complete search history.

(56) References Cited

U.S. PATENT DOCUMENTS 6,982,470 B2 1/2006 Omori (Continued)

FOREIGN PATENT DOCUMENTS

JP 2000-183205 6/2000

(Continued)

*Primary Examiner*—Cuong Q Nguyen
(74) *Attorney, Agent, or Firm*—Harness, Dickey & Pierce, P.L.C.

(57) ABSTRACT

An image sensor device including a protective plate may be manufactured from an image sensor chip having an active surface and a back surface opposite to the active surface. The image sensor chip may include chip pads formed in a peripheral region of the active surface, a microlens formed in a central region of the active surface and an intermediate region between the peripheral and central regions. A protective plate may be attached to the intermediate region of the active surface of the image sensor chip using an adhesive pattern that is sized and configured to maintain a separation distance between the protective plate and the microlens formed on the image sensor chip. Conductive plugs, formed before, during or after the manufacture of the image sensor chip circuitry may provide electrical connection between the chip pads and external connectors.

12 Claims, 15 Drawing Sheets

U.S. PATENT DOCUMENTS

| | | | |
|---|---|---|---|
| 7,001,797 B2 * | 2/2006 | Hashimoto | 438/113 |
| 7,030,471 B2 | 4/2006 | Perillat | |
| 7,037,747 B2 * | 5/2006 | Omori | 438/67 |
| 7,112,864 B2 | 9/2006 | Tsukamoto et al. | |
| 2004/0094825 A1 | 5/2004 | Onishi et al. | |
| 2004/0251510 A1 | 12/2004 | You et al. | |

FOREIGN PATENT DOCUMENTS

| | | |
|---|---|---|
| JP | 2004-063757 | 2/2004 |
| JP | 2004-88082 | 3/2004 |
| KR | 2002-0061221 | 1/2003 |
| KR | 2003-0091389 | 12/2003 |

* cited by examiner

IMAGE SENSOR DEVICE AND METHOD OF MANUFACTURING THE SAME

PRIORITY STATEMENT

This application is a divisional of U.S. application Ser. No. 11/177,335, filed Jul. 11, 2005, now U.S. Pat. No. 7,262,475, which claims priority under 35 U.S.C. § 119 to Korean Patent Application No. 10-2005-0001684, filed on Jan. 7, 2005, the entire contents of which are incorporated herein by reference.

BACKGROUND

1. Technical Field

Example embodiments relate to semiconductor chips and methods for manufacturing such semiconductor chips and, more particularly, to image sensor chips having a protective plate and methods for manufacturing such image sensor chips.

2. Description of the Related Art

Image sensor modules may include solid state image sensing devices or complimentary metal oxide semiconductor (CMOS) image sensors (CISs). The image sensor modules may pick up an image of an object and output corresponding electrical signals using photoelectric conversion devices and charge coupled devices (CCDs). Image sensor modules are utilized in a wide range of applications including, e.g., digital cameras, digital camcorders, telecommunication terminals, camera phones, multi-media personal computers, and surveillance cameras.

FIG. 1 is a plan view of a conventional image sensor module 10 and FIG. 2 is a cross-sectional view taken along the line I-I as indicated in FIG. 1. As illustrated in FIGS. 1 and 2, a conventional image sensor module 10 may include a flexible circuit substrate 1 and an image sensor chip 2 mounted on an upper surface of the flexible circuit substrate 1. A lens unit 7 may be formed on the upper surface of the flexible circuit substrate 1 surrounding or at least partially surrounding the image sensor chip 2 and may incorporate a lens 8 for focusing an image on the image sensor chip and/or protecting the image sensor chip.

The image sensor chip 2 has an active surface on which chip pads 4 may be formed in peripheral regions of the active surface. A microlens 5 may be formed toward the center region of the active surface and bonding wires 6 may be used for forming electrical connections between conductive regions provided on the flexible circuit substrate 1 and corresponding ones of the chip pads 4 provided on the image sensor chip 2. If present, the lens 8 of the lens unit 7 may be aligned with and cooperate with the microlens 5 of the image sensor chip 2 for directing an image onto at least a portion of the active surface of the image sensor chip.

The active surface of the image sensor chip 2 may be exposed to the external environment before being positioned within the protection provided by the lens unit 7. During this period of exposure, the microlens 5 may become contaminated with fine particles present in the external environment. Such contaminants present on the microlens 5 may result in faulty or degraded image sensor modules, thereby reducing productivity, accuracy and/or sensitivity.

As illustrated in FIGS. 1 and 2, a conventional image sensor module 10 may use bonding wires 6 for connecting the image sensor chip 2 to the flexible circuit substrate 1. This use of bonding wires 6 will tend to result in an increased electrical connection path between the image sensor chip and the flexible circuit substrate, thereby tending to reduce the processing speed of the image sensor module. Further, the volume provided within the lens unit 7 in order to accommodate the bonding wires 6 will also tend to increase the thickness of the resulting image sensor module, thereby limiting the extent to which the image sensor module may be miniaturized or otherwise reduced in size and/or weight.

SUMMARY

Example embodiments provide image sensor chips in which the contamination to which a microlens manufactured at wafer level may be subjected is reduced or eliminated.

Example embodiments also provide image sensor chips in which the length of electrical connection paths formed between an image sensor chip and a flexible circuit board may be reduced.

Example embodiments additionally provide image sensor chips that may be incorporated in smaller and/or lighter image sensor modules.

According to example embodiments, a wafer may be formed with an active surface, on which one or more image sensor chips are formed, and a back surface opposite the active surface. Each image sensor chip will be formed on a portion of the active surface opposite a corresponding portion of the back surface provided opposite the active surface. Each of the image sensor chips may include chip pads formed in peripheral regions and a microlens formed in central regions of the active surface.

A protective plate may be formed with a photosensitive adhesive pattern formed on a primary surface with the photosensitive adhesive patterns arranged to correspond to a portion of the active surface of the image sensor chip that extends between or separates the peripheral chip pads and the more centrally located microlens. The protective plate may be aligned and then attached to the active surface of the wafer using the photosensitive adhesive patterns whereby the adhesive patterns tend to contact the active surface of the image sensor chips in the region between the microlens and the chip pads.

Connection holes may be formed on the back surface of the wafer to expose the chip pads. An insulating layer may then be formed on the back surface of the wafer including the inner walls of the connection holes. Metals plugs may be formed in the connection holes and connected to the chip pads. Solder balls may then be formed on the conductive plugs.

The photosensitive adhesive patterns may use a photosensitive polymer and may be formed to a thickness sufficient to ensure that the protective plate will be separated from the microlens formed on the image sensor chip. The protective plate may cover the active surface of the wafer and may be formed of glass or quartz. The conductive plugs may be formed adjacent the chip pads and electrically connected to the chip pads using redistribution lines. The connection holes may be formed adjacent the chip pads.

A method for manufacturing image sensor chips may also include preparing a wafer, e.g., a wafer at or near the completion of a semiconductor fabrication process, having an active surface and a back surface opposite to the active surface. The wafer may include a plurality of image sensor chips and scribe lines or kerf regions formed between and separating the active surfaces of adjacent image sensor chips. Each image sensor chip will have an active surface and a corresponding back surface opposite to the active surface. The image sensor chip will typically include chip pads formed in peripheral regions of the active surface and a microlens formed in a more central region of the active surface.

A protective plate may be manufactured with a photosensitive adhesive pattern formed on one surface thereof. The photosensitive adhesive patterns may be arranged to correspond to spaces defined between the chip pads and the microlens on each of the image sensor chip. The protective plate may then be aligned and attached to the active surface of the wafer using the photosensitive adhesive patterns whereby the photosensitive adhesive patterns contact the active areas of the image sensor chips in one or more intermediate or bonding regions between the microlens and the chip pads.

Connection holes may be formed from the back surface of the wafer to expose the lower surfaces of the chip pads. Conductive plugs may then be formed in the connection holes to extend through the remaining portion of the image chip substrate and thereby provide electrical connections to the chip pads. Solder balls may be formed on the portion of the conductive plugs adjacent the back surface of the wafer. The wafer and the protective plate may then be sawn or otherwise separated along the scribe lines in order to remove those portions of the wafer between adjacent image sensor chips and thereby separate the individual image sensor chips with each chip having a corresponding portion of the protective plate.

A method for manufacturing an image sensor chip may also include preparing a wafer, e.g., a wafer near the completion of a semiconductor fabrication process, having chip areas separated by scribe lines formed between adjacent chip areas. Connection holes may be formed on the active surface of the wafer along the periphery of the chip area with conductive plugs then being formed in the connection holes. Chip pads provided on peripheral regions of the active surface of the chip area may be connected to the conductive plugs and a microlens may be formed on more central portions of the active surface of the chip area.

A protective plate having a photosensitive adhesive pattern formed on one surface thereof may be prepared and then aligned with and attached to the active surface of the wafer. The photosensitive adhesive patterns may be arranged or configured so as to correspond to portions of the active surface of the chip areas between the chip pads and the microlens. The back surface of the wafer may be backlapped or ground to expose a portion of the conductive plugs. Solder balls may then be formed on the exposed portion of the conductive plugs. The wafer and the protective plate may then be sawn or otherwise separated along the scribe lines to produce individual image sensor chips each having a corresponding portion of the protective plate.

BRIEF DESCRIPTION OF THE DRAWINGS

Example embodiments may be better appreciated with reference to the following detailed description thereof provided in conjunction with the accompanying drawings, wherein like reference numerals designate like structural elements.

FIG. 3 is a schematic plan view of a wafer having image sensor chips.

FIG. 4 is an enlarged plan view of the image sensor chips of FIG. 3.

FIG. 5 is a cross-sectional view taken along the line of II-II of FIG. 4.

FIG. 6 is a plan view of a protective plate.

FIG. 7 is a cross-sectional view of forming a photosensitive adhesive layer.

FIG. 8 is a cross-sectional view of forming photosensitive adhesive patterns.

FIG. 9 is a cross-sectional view of aligning a protective plate on a wafer.

FIG. 10 is a cross-sectional view of attaching a protective plate to a wafer.

FIG. 11 is a cross-sectional view of wafer backlapping.

FIG. 12 is a cross-sectional view of forming a connection hole in a wafer.

FIG. 13 is an enlarged cross-sectional view of section A of FIG. 12, showing formation of an insulating layer.

FIG. 14 is a cross-sectional view of forming an UBM layer.

FIGS. 15 through 17 are cross-sectional views illustrating incremental stages in the formation of a metal conductive plug.

FIG. 18 is a cross-sectional view of forming a solder ball.

FIG. 19 is a cross-sectional view of separating a wafer into individual image sensor chips.

FIG. 21 is a cross-sectional view of a silicon substrate.

FIG. 22 is a cross-sectional view of forming connection holes.

FIG. 23 is a cross-sectional view of forming conductive metal plugs.

FIG. 24 is a cross-sectional view of forming chip pads and microlenses.

FIG. 25 is a cross-sectional view of attaching a protective plate.

FIG. 26 is a cross-sectional view of wafer backlapping.

FIG. 27 is a cross-sectional view of forming solder balls.

FIG. 28 is a cross-sectional view of separating a wafer into individual image sensor chips.

These drawings are provided for illustrative purposes only and are not drawn to scale. The spatial relationships and relative sizing of the elements illustrated in the various embodiments may have been reduced, expanded, or rearranged to improve the clarity of the figure with respect to the corresponding description. The figures, therefore, should not be interpreted as accurately reflecting the relative sizing or positioning of the corresponding structural elements that could be encompassed by an actual device manufactured according to example embodiments.

DETAILED DESCRIPTION OF EXAMPLE EMBODIMENTS

Example, non-limiting embodiments will now be described more fully below with reference to the accompanying drawings. As will be appreciated by those skilled in the art, however, examples may be embodied in many different forms and should not be construed as limited to example embodiments set forth herein. Rather, example embodiments have been provided so that this disclosure will be thorough and complete, and will fully convey the scope of the disclosure to those skilled in the art. The principles and features of example embodiments may be employed in varied and numerous embodiments without departing from the scope of the disclosure.

It should be noted that the figures are intended to illustrate the general characteristics of methods and devices of example embodiments, for the purpose of the description of such example embodiments herein. These drawings are not, however, to scale and may not precisely reflect the characteristics of any given embodiment, and should not be interpreted as defining or limiting the range of values or properties of example embodiments within the scope of this disclosure. Indeed, for simplicity and clarity of illustration, the dimensions of some of the elements are exaggerated relative to other elements. Further, well-known structures and processes known to those skilled in the art are not described or illustrated in detail to avoid obscuring the disclosure.

EXAMPLE 1

FIGS. 3 through 19 are views showing representative stages of manufacture during the fabrication of an image sensor chip in accordance with example embodiments.

Figure 1:
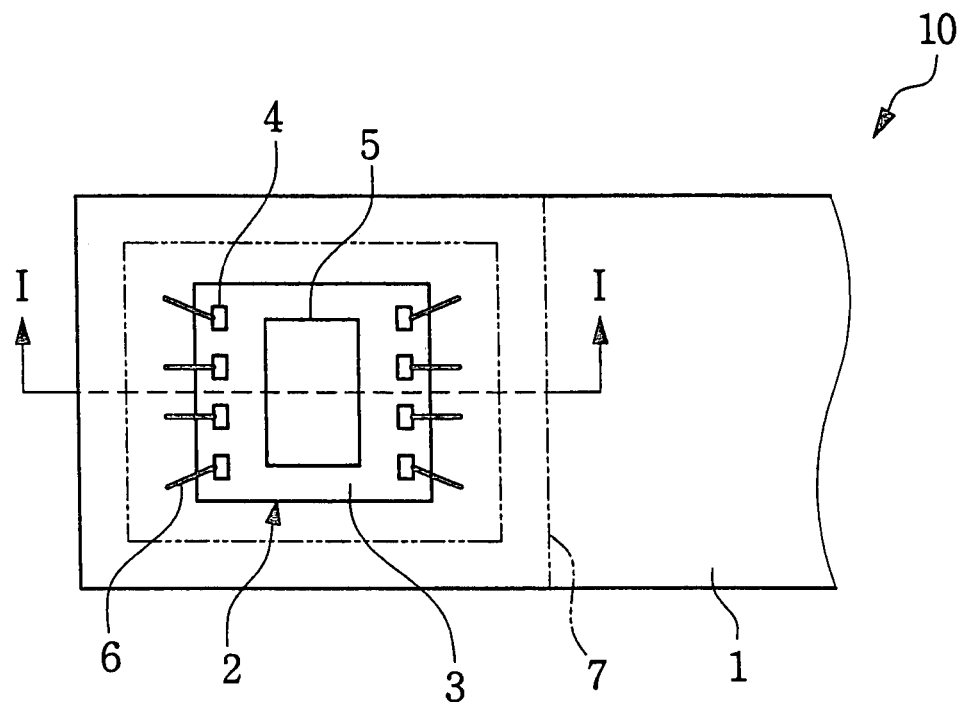
FIG. 1 is a plan view of a conventional image sensor module having an image sensor chip.
Figure 2:
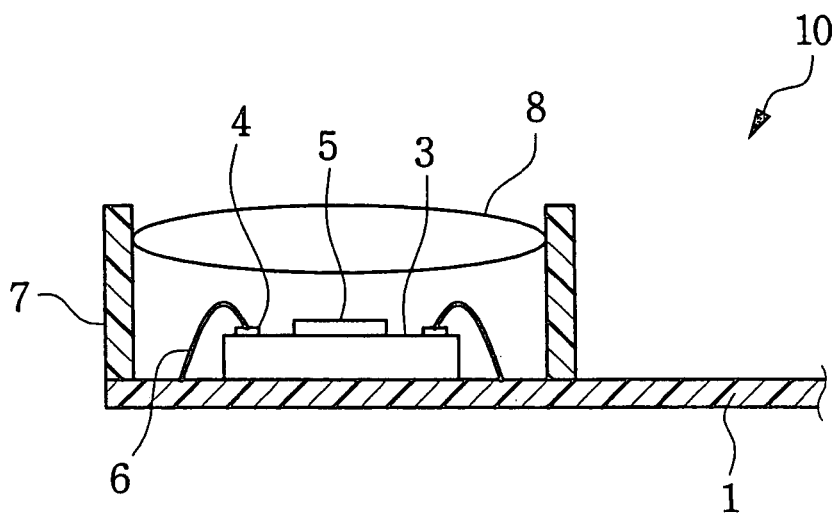
FIG. 2 is a cross-sectional view taken along the line of I-I of FIG. 1.
Figure 3:
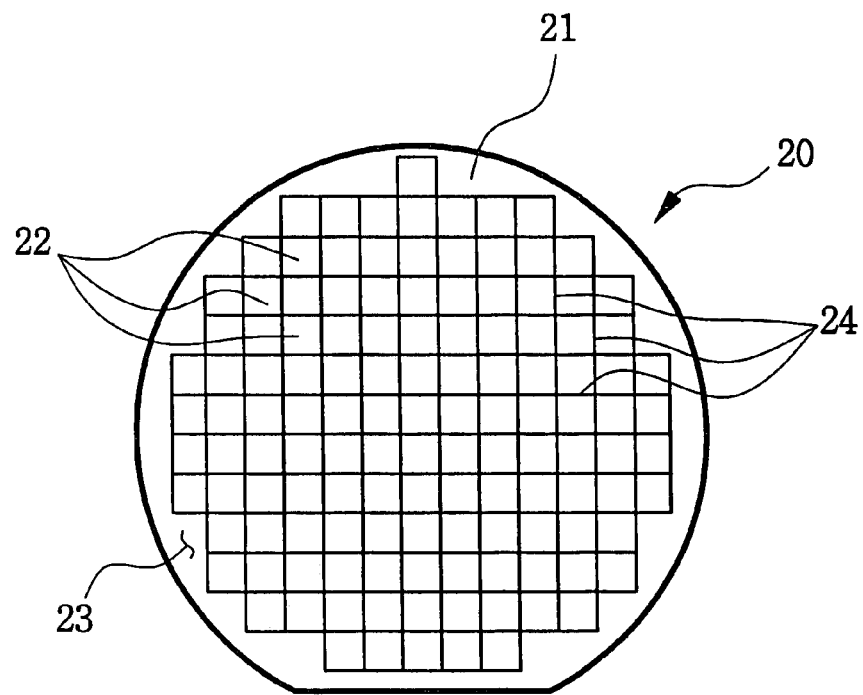
FIGS. 3 through 19 are views showing representative stages of manufacture during the fabrication of an image sensor chip in accordance with example embodiments.

Illustrated in FIG. 3 is a wafer 20, e.g., a semiconductor wafer 21 that has completed, or substantially completed, a semiconductor device fabrication process, on which a plurality of image sensor chips 22 have been formed on an active surface 23. A back surface 29 (not shown) will be on the wafer surface opposite the active surface 23. Adjacent ones of the plurality of image sensor chips 22 are separated by first scribe lines 24. Because the specific integrated circuits used to construct the image sensor chips 22 are not necessary for understanding example embodiments, the detailed description of integrated circuits has been omitted.

Figure 4:
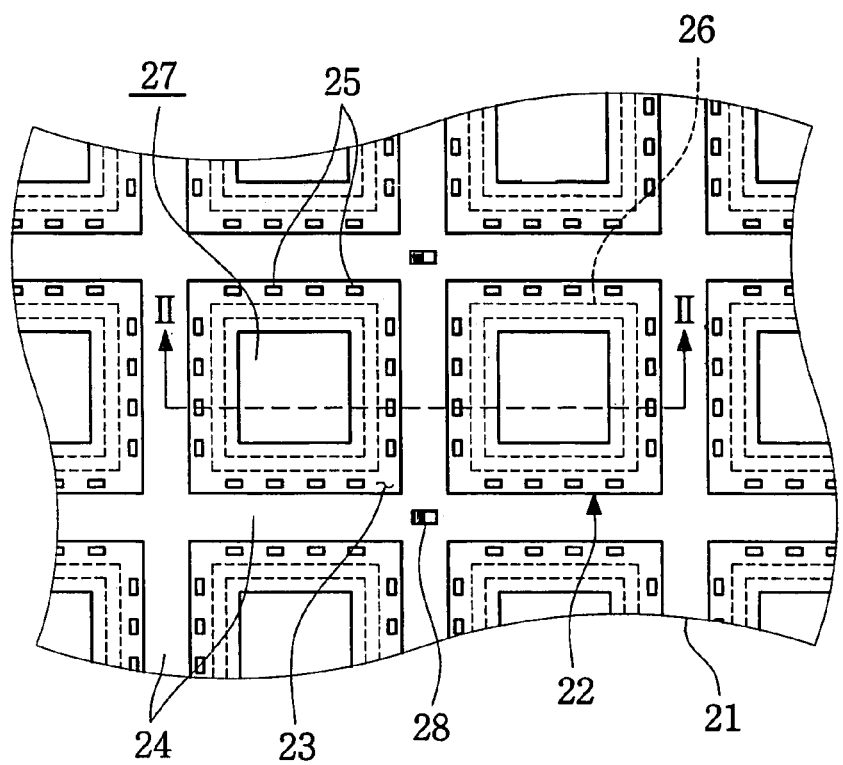
Figure 5:
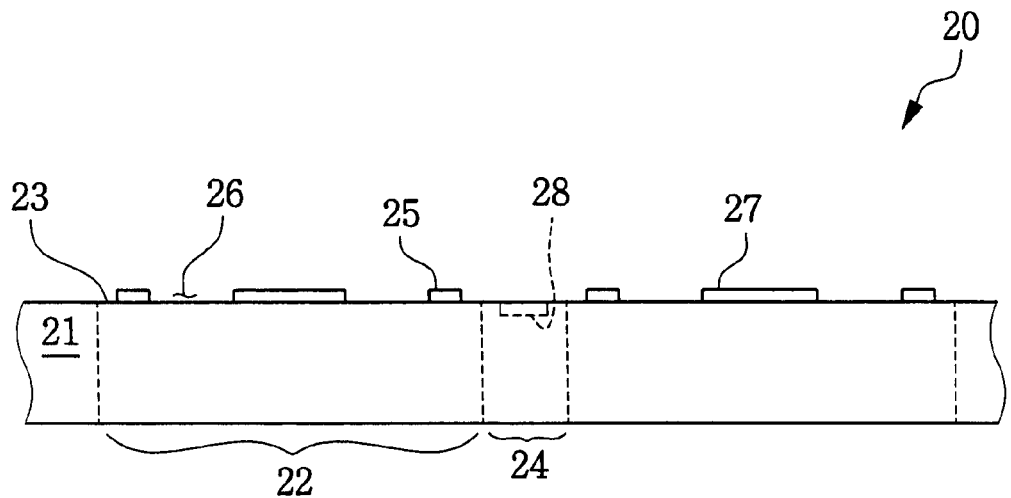

As illustrated in FIGS. 4 and 5, each image sensor chip 22 may have a plurality of chip pads 25 formed in a peripheral region of the active surface and a microlens 27 formed at more central region of the active surface. The image sensor chip 22 may further include an area 26 of the active surface (hereinafter referred to as an adhesive region, attachment region, bonding region or intermediate region) between the peripheral chip pad region and the more central microlens area. The adhesive region 26 may be provided with additional structures (not shown) or formed from a material that will increase the bond strength between the surface and the adhesive.

The wafer 20 may further include first alignment marks 28 formed on the active surface 23, typically in the first scribe lines 24, which may be arranged at the intersections of the first scribe lines 24. However, the arrangement of the first alignment marks 28 may be not limited in this regard. For example, the first alignment marks 28 may be formed in an area where the image sensor chips 22 are not formed, e.g., a drop-out area, or may be formed in a portion of the first scribe lines 24 between the peripheral regions of two adjacent image sensor chips. The first alignment marks 28 are typically formed using the process steps used to form the integrated circuits and are configured and positioned for detection by optical instruments, e.g., cameras, associated with controllers for adjusting the X-Y and rotational positioning of the wafer guided by the first alignment marks.

Figure 6:
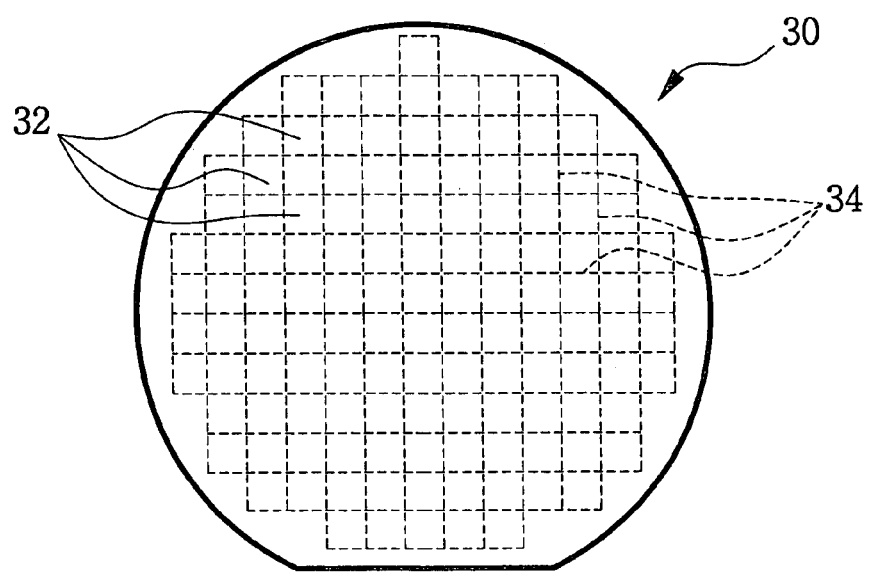
Figure 7:
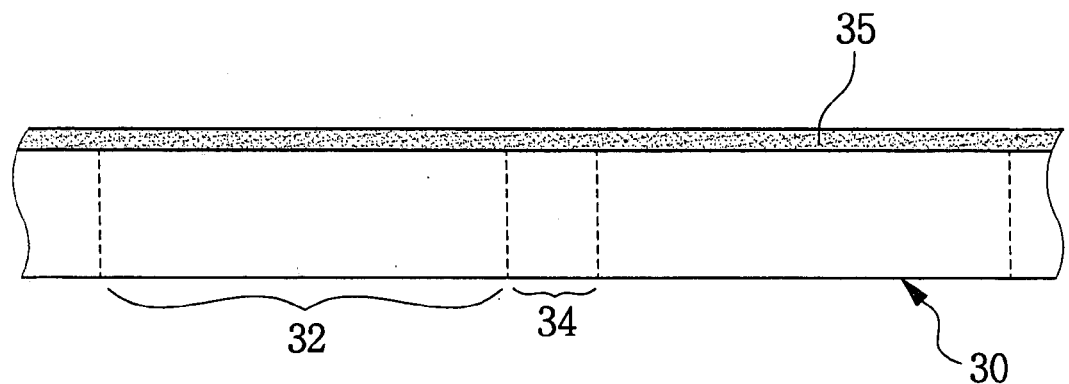
Figure 8:
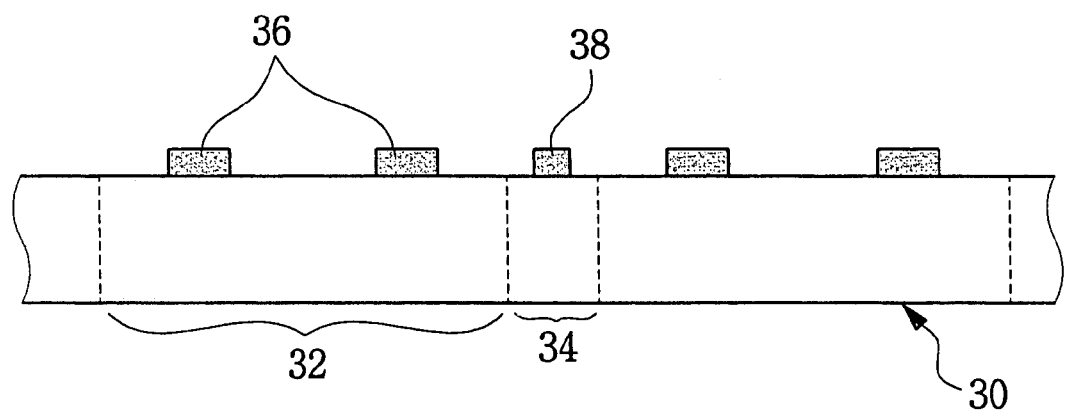

As illustrated in FIGS. 6 through 8, a protective plate 30 having photosensitive adhesive patterns 36 may be provided. The protective plate 30 may be a transparent protective plate having a shape that corresponds closely to that of the wafer to which it will be applied and will typically have a thickness sufficient to provide adequate mechanical strength for the intended processing and intended applications for the resulting image sensing devices. The protective plate 30 may be formed of transparent materials, e.g., glass or quartz and may be configured with a plurality of individual protective plates 32 and second scribe lines 34 formed between adjacent individual protective plates.

As illustrated in FIG. 7, a photosensitive adhesive layer 35 may be formed on one surface of the protective plate 30 using a spray method, a spin-on dispensing method, a vaporization method, or a dry film attaching method. For example, the spray method may be used to spray a layer of the photosensitive adhesive on one surface of the protective plate 30. Alternatively, the spin-on dispensing method may apply a volume of the photosensitive adhesive to the center of one surface of the protective plate 30 after which the protective plate 30 is spun to distribute the adhesive across the surface. The vaporization method may be use to deposit a photosensitive adhesive on one surface of the protective plate 30 while the dry film attaching method may be used for attaching a preformed photosensitive adhesive sheet to one surface of the protective plate 30.

The photosensitive adhesive layer 35 will typically have a thickness sufficient to maintain separation between the unpatterned portion of the one surface of the protective plate 30 and the upper surface of structures formed on the active surface 23 of the image sensor chip 22, particularly the upper surface of the microlens 27 (FIG. 5). The photosensitive adhesive layer 35 may be formed from a photosensitive polymer which can be patterned using a photolithography process.

As illustrated in FIG. 8, the photosensitive adhesive layer 35 may then be patterned to form photosensitive adhesive patterns 36. For example, a portion of the photosensitive adhesive layer 35 may be removed using a typical photolithography process, while a portion of the photosensitive adhesive layer 35 corresponding to the adhesive region 26 (FIG. 4) of the image sensor chip 22 (FIG. 4) may remain. Because the photolithography processes suitable for forming such layers and patterns are well-known to those skilled in the art, a more detailed description of the photolithography processes is unnecessary and has been omitted. The photosensitive adhesive patterns 36 are not, however, cured so that the adhesive composition used to form the photosensitive adhesive patterns will maintain its adhesive strength for attachment to the wafer 21.

The photosensitive adhesive layer 35 applied to the protective plate 30 may also be used to form second alignment marks 38 during the formation of the photosensitive adhesive patterns 36. The second alignment marks 38 may be arranged and configured to correspond to the first alignment marks 28 (FIG. 4) and may be provided at the intersections of the second scribe lines 34 or between adjacent ones of the individual protective plates 32.

Figure 9:
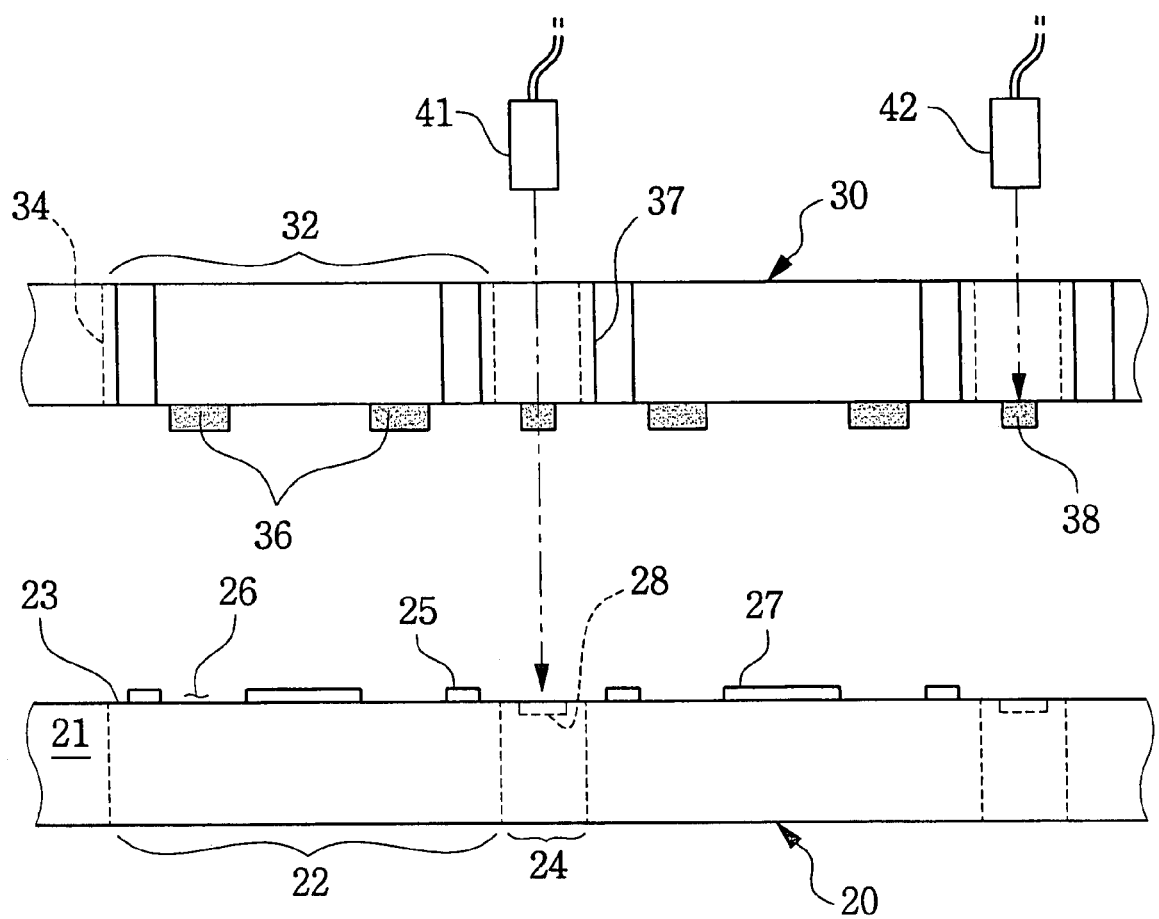
Figure 10:
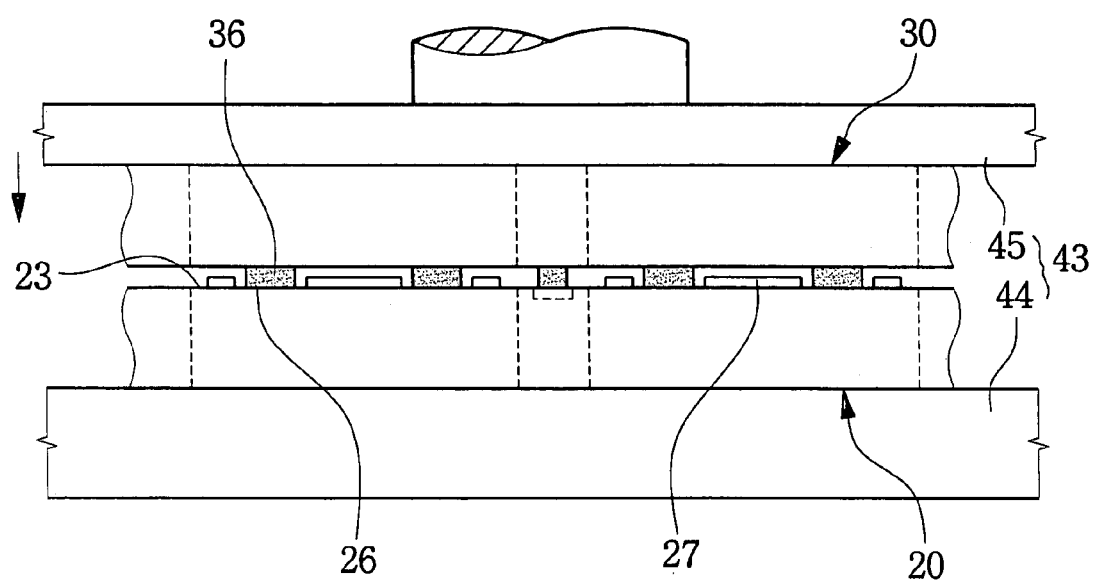

As illustrated in FIGS. 9 and 10, the protective plate 30 may be attached to the active surface 23 of the wafer 20. As shown in FIG. 9, the protective plate 30 may be aligned with the active surface 23 of the wafer 20 whereby the photosensitive adhesive patterns 36 formed on the protective plate 30 face the active surface 23 of the wafer 20. The relative positioning of the wafer 20 and the protective plate 30 may then be adjusted so that the photosensitive adhesive patterns 36 provided on the protective plate 30 are positioned opposite the corresponding adhesive regions 26 provided on the image sensor chip 22.

An alignment process may be performed using the first alignment marks 28 and the second alignment marks 38 during which the first and second alignment marks may be perceived by a first optical instrument 41 and a second optical instrument 42. For example, the first optical instrument 41 may perceive the first alignment mark 28, memorize the coordinate position of the first alignment mark 28, and transmit the information to the second optical instrument 42. The second optical instrument 42 having a fixed coordinate may move the protective plate 30 so as to be able to perceive the second alignment mark 38 and align the second alignment mark 38 with the first alignment mark 28, thereby aligning the photosensitive adhesive patterns 36 with the corresponding adhesive regions 26 provided on the image sensor chips 22.

As shown in FIG. 10, the protective plate 30 may be attached to the active surface 23 of the wafer 20 using a thermocompression process. In this process, a combination of heat and pressure may be applied to the protective plate 30 mounted on the active surface 23 of the wafer 20 to cause the photosensitive adhesive patterns 36 to become attached to the corresponding adhesive regions 26 provided on the image sensor chips 22.

For example, a wafer 20 on which a protective plate 30 has been aligned and positioned may be loaded in a thermocompressor 43 in which a combination of heat and pressure sufficient to cause the photosensitive adhesive patterns 36 to become attached to the corresponding adhesive regions 26. For example, the wafer 20 having the protective plate 30 may be placed on the upper surface of a heater 44 of the thermocompressor 43 where its temperature will be increased to a point sufficient for the thermocompression process. A compressor plate or assembly 45 provided in the thermocompressor 43 may move downward onto the exposed upper surface of the protective plate 30.

The compressor plate 45 may be used to force the protective plate 30 and its photosensitive adhesive patterns 36 toward the active surface 23 of the wafer 20 and apply a suitable force for a period sufficient to attach the protective plate to the wafer. The photosensitive adhesive pattern 36 may be partially or completely cured during the thermocompression process and thereby attach the protective plate 30 to the wafer 20. The compressor plate 45 may then be retracted to reduce the pressure on the protective plate and allow the wafer 20 and the attached protective plate 30 to be unloaded from the thermocompressor 43.

As noted above, the thickness of the photosensitive adhesive patterns 36 should be sufficient to maintain separation between the surface of the protective plate 30 facing the active surface 23 of the wafer 20 and structures, particularly the microlens 27, formed on the active surface 23 of the image sensor chip 22, both during and after the thermocompression process.

Figure 11:
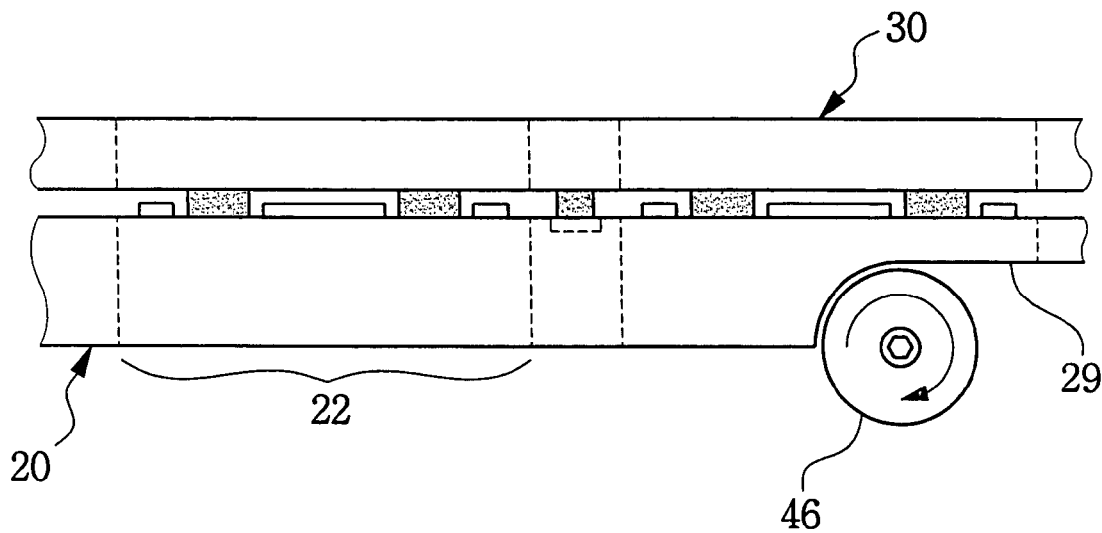

As illustrated in FIG. 11, a portion of the back surface 29 of the wafer 20 may then be removed by backlapping or grinding the wafer to remove a portion of its original thickness. A backlapping process may be performed using a grinder 46 for a thin wafer. For example, where the initial thickness of the wafer 20 may be about 700 μm, the thickness of the backlapped wafer 20 may be 100 μm or less. Other techniques are available for structurally reinforcing or supporting the wafer during the backlapping process to allow more material to be removed from the backside 29 of the wafer 20 to allow for the production of thinner substrates.

Figure 12:
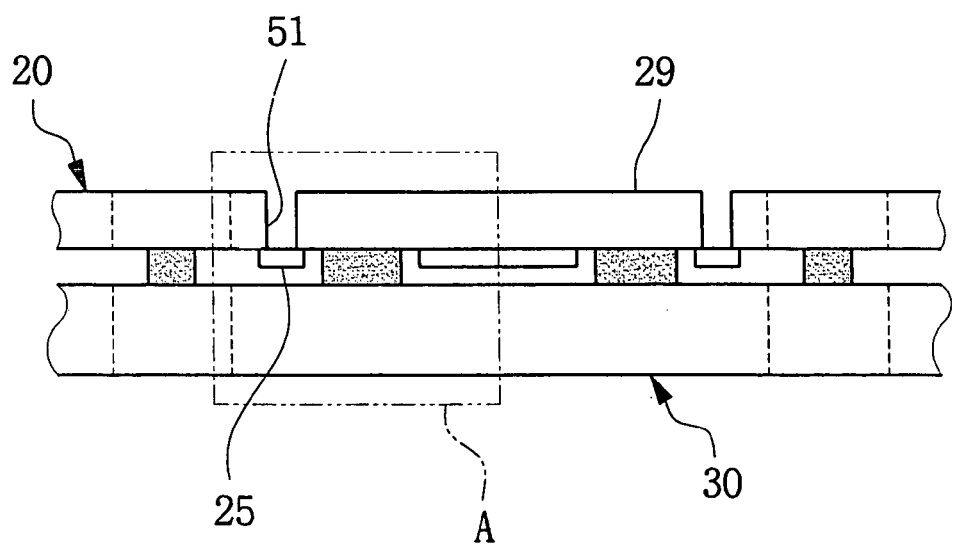

As illustrated in FIG. 12, a connection hole 51 may be formed through the thinned wafer from the back surface 29 of the wafer 20. The connection hole 51 may be formed using a drilling method to expose a portion of the backside of the chip pads 25. The connection hole 51 may be sized such that the connection hole allows for electrical connection to the chip pad 25.

Figure 13:
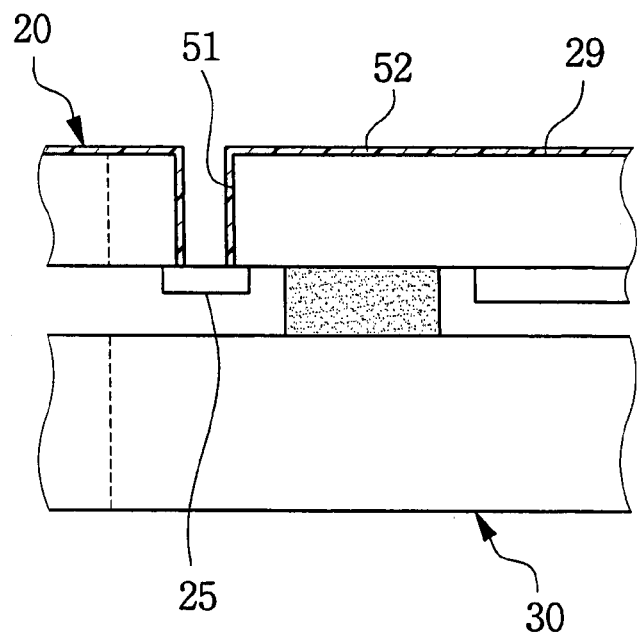

As illustrated in FIG. 13, an insulating layer 52 may be formed on the back surface 29 of the wafer 20 including the inner walls of the connection hole 51. The insulating layer 52 may provide an electrical insulation between the subsequently formed conductive plug and the inner walls of the connection hole 51. The insulating layer 52 may be formed using a chemical vapor deposition method and may be formed from any suitable insulating material, including, e.g., silicon nitride. A bottom portion of the insulating layer 52 formed in the connection hole 51 may be removed to expose the backside of chip pad 25.

Figure 14:
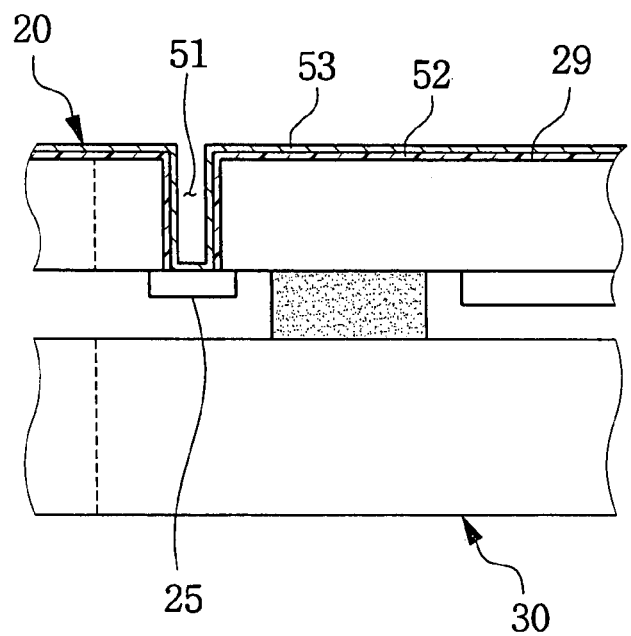

As illustrated in FIG. 14, a UBM layer 53 may be formed on the insulating layer 52, the inner walls of the connection hole 51 and the chip pad 25. The UBM layer 53 may be formed using any suitable method including, e.g., a sputtering method. The UBM layer 53 may include a Ti layer and a Cu layer. The thickness of the UBM layer 53 may be between 5 μm and 10 μm. The UBM layer 53 will typically be formed from metals exhibiting both good adhesion to the material selected for forming the insulating layer 52, for example Cr or Ti, and/or metals or other conductive materials exhibiting good wettability to soldering with a metal plug, e.g. Ag, Au, Cu, Ni, Pd, or Pt. Therefore, the UBM layer 53 may be a multilayer structure including combinations of two or more metals including, e.g., Ti/Cu, Ti/Pd, Ti/Pt, Ti/Ni, Cr/Cu, or alloys thereof.

Figure 15:
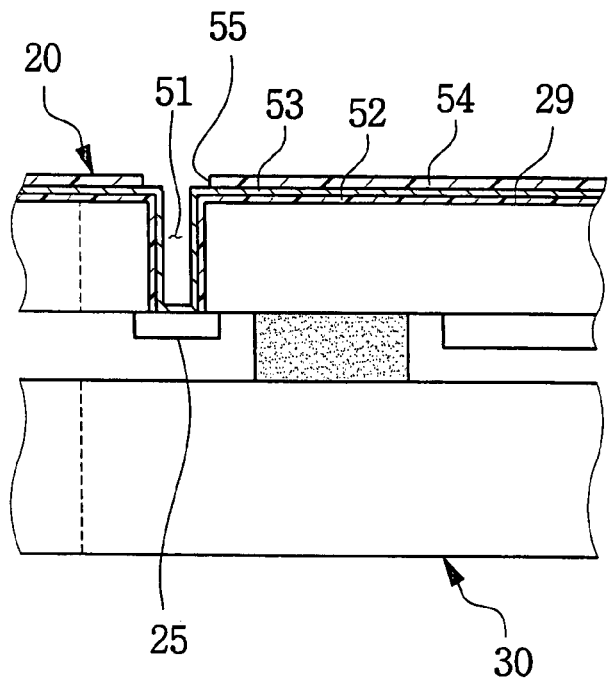
Figure 16:
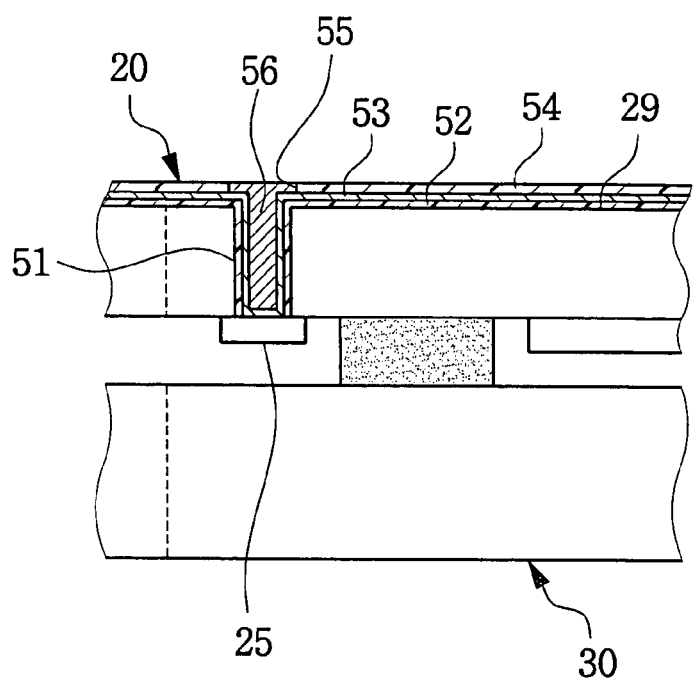
Figure 17:
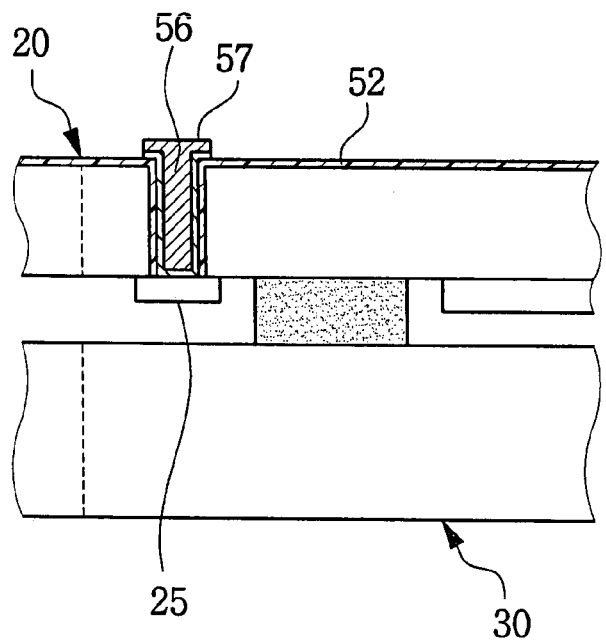

As illustrated in FIGS. 15 through 17, a conductive plug 56, typically a metal plug, may be formed in that portion of the connection hole 51 opening remaining after deposition of the UBM layers. One technique for forming the conductive plug is a plating process using a masking pattern 54. As illustrated in FIG. 15, the masking pattern 54 may be formed on the insulating layer 53 of the back surface 29 of the wafer 20 to expose the connection hole 51 and some of the surrounding back surface. The masking pattern 54 may then be formed using a conventional photolithography process, for example a sequence of forming a photoresist layer, exposing the photoresist layer and developing the exposed photoresist layer. Developing the exposed photoresist layer will remove the photoresist from regions of the back surface 29 and form openings or windows 55 in the photoresist layer to create the masking pattern 54. The window 55 may expose a portion of the UBM layer 53 including the connection hole 51.

As illustrated in FIG. 16, a conductive plug 56 may be formed. In those instances in which the conductive material includes one or more metals, the conductive plug 56 may be formed on the exposed portions of the UBM layer 53 by utilizing a plating process in which the UBM layer 53 serves as an electrode. The conductive plug 56 may be formed from a single metal or a metal alloy that exhibits sufficient wettability to soldering to configure the wafer for the subsequent processing. For example, the conductive plug 56 may be formed from one or more materials selected from a group consisting of, e.g., Ag, Au, Cu, Ni, Pd, Pt, and their alloys.

Although this example embodiment shows the conductive plug 56 formed by a plating process using the masking pattern 54, the conductive plug 56 may be formed using a reflow process that utilizes a metal powder or a metal paste for filling the remainder of the connection hole 51. As illustrated in FIG. 17, the masking pattern 54 (FIG. 16) and a portion of the UBM layer 53 under the masking pattern may be removed to form a ball pad 57 on which a solder ball will subsequently be formed.

Figure 18:
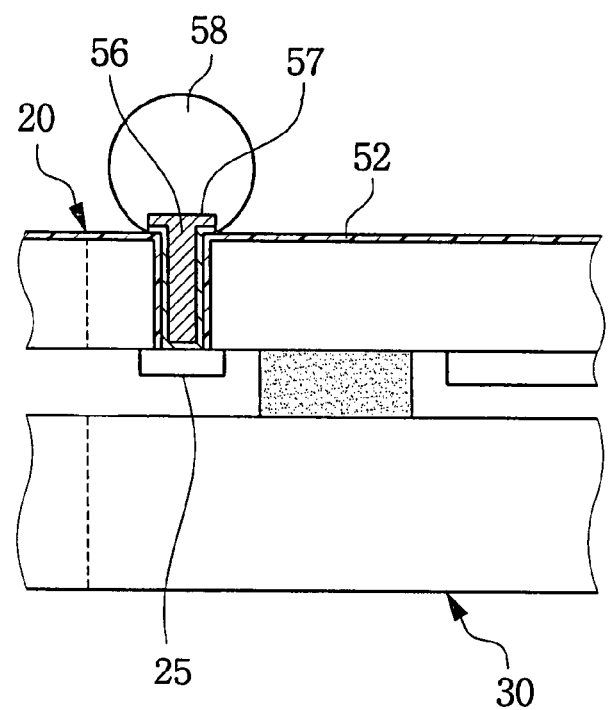

As illustrated in FIG. 18, a solder ball 58 may be formed on the ball pad 57 using a variety of methods including, e.g., the ball placement method, the plating method, the stencil printing method, or the metaljet method. Further, although illustrated and described as a solder ball 58, these external connection structures may be achieved using a Ni or Au bump rather than a solder ball.

Figure 19:
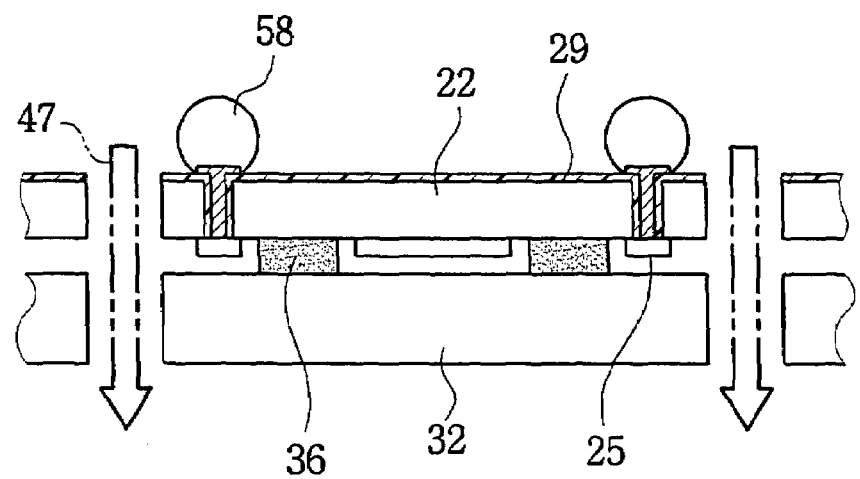

As illustrated in FIG. 19, a wafer 20 to which protective plate 30 has been attached may be separated into individual image sensor chips 22. The portions of wafer 20 under the first scribe lines 24 (FIG. 5) may be removed using a circulating sawing device 47, other mechanical abrasion method or a non-contact method, e.g., a laser, to obtain individual image sensor chips 22 with each image sensor chip including a corresponding portion of the protective plate 32.

Therefore, the microlens 27 of the image sensor chip 22 may have the protective plate 32 positioned above the image sensor chips while the chips are still at the wafer level, thereby putting protective plate 32 in place before the image sensor chips are exposed to the external environment, thereby reducing or eliminating contamination of the microlens 27 during subsequent processing, e.g., fine particulate contaminates found in the air.

The protective plates 32 may be simultaneously attached to a plurality of the image sensor chips 22, thereby mass producing image sensor chips 22 each having a corresponding individual protective plate 32.

Figure 20:
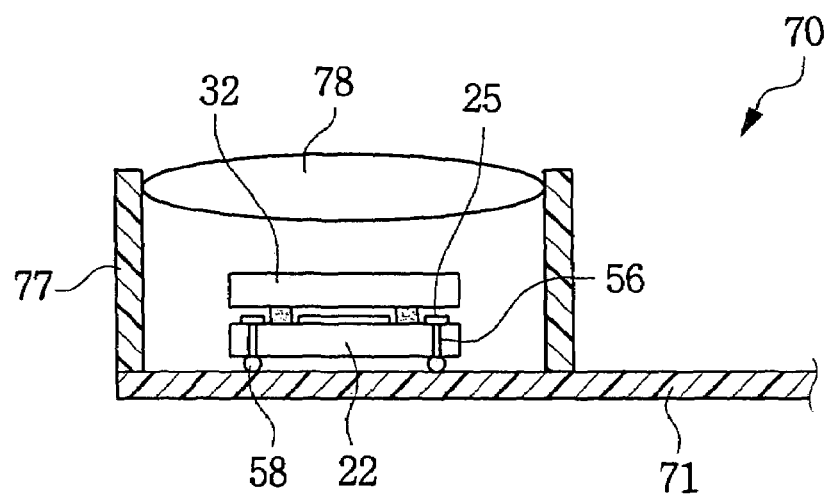
FIG. 20 is a cross-sectional view of an image sensor chip having a protective plate in accordance with example embodiments.

Further, the image sensor chip 22 may have solder balls 58, thereby allowing incorporation of an image sensor module 70. FIG. 20 is a cross-sectional view of an image sensor module 70 having an image sensor chip 22 in accordance with example embodiments.

As illustrated in FIG. 20, the image sensor module 70 may include an image sensor chip 22 and a flexible circuit substrate 71. The image sensor chip 22 having a protective plate 32 may be mounted on the flexible circuit substrate 71 using solder balls 58. A lens unit 77 may be attached to a portion of the flexible circuit substrate 71 arranged and configured to receive and accommodate the image sensor chip 22. The lens unit 77 may include a lens 78 arranged and configured to face the corresponding microlens 27 provided on the active surface of the image sensor chip 22.

The flexible circuit substrate 71 may be electrically connected to the image sensor chip 22 through the chip pad 25, conductive plug 56 and solder ball 58, thereby reducing the electrical connection path between the image sensor chip 22 and the flexible circuit substrate 71.

EXAMPLE 2

FIGS. 21 through 28 are views showing representative stages of manufacture during the fabrication of an image sensor chip in accordance with example embodiments.

The method may utilize a wafer that has not completed, or even substantially completed, a semiconductor device fabrication process. A silicon substrate 121 and a protective plate 130 may be prepared. The preparation of the protective plate 130 will typically include forming photosensitive adhesive patterns 136 on a surface of the protective plate in a manner similar to that described above with respect to the first example embodiment. As the processes and methods for forming such patterns are well known to those skilled in the art, the detailed description of the incorporated steps is unnecessary and will, accordingly, be omitted.

Figure 21:
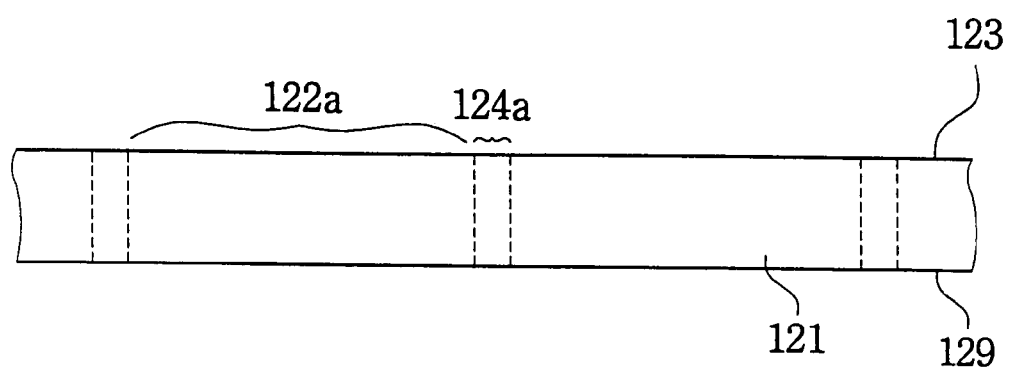
FIGS. 21 through 28 are views showing representative stages of manufacture during the fabrication of an image sensor chip in accordance with example embodiments.

As illustrated in FIG. 21, the silicon substrate 121 may be provided with an active surface 123 and a back surface 129 opposite the active surface 123. The silicon substrate 121 may have plurality of chip areas 122a and separated by a plurality of first scribe lines 124a formed between adjacent chip areas 122a.

Figure 22:
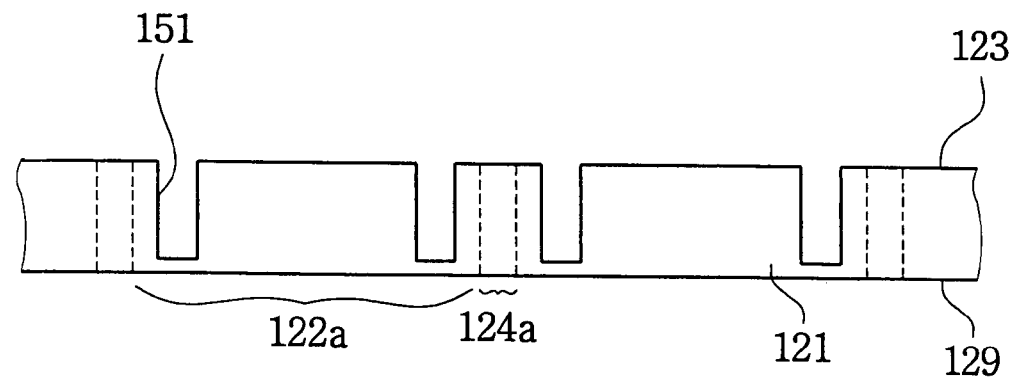

As illustrated in FIG. 22, connection holes 151 may be formed into the silicon substrate 121 from the active surface 123. For example, the connection holes 151 may be formed in the active surface 123 of the silicon substrate 123 using a drilling method. The connection holes 151 may be arranged along the periphery of the chip areas 122a with the depth of the connection hole 151 being sufficient whereby a portion of conductive plugs formed in the connection hole 151 will be exposed during the wafer backlapping process.

Figure 23:
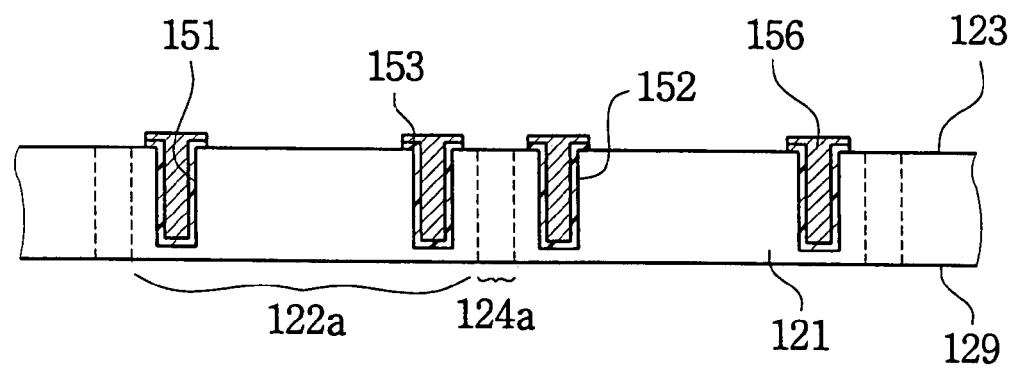

As illustrated in FIG. 23, conductive plugs 156 may be formed in the connection holes 151. For example, an insulating layer 152 may be formed on the active surface 123 of the silicon substrate 123 including the connection holes 151. A UBM layer 153 may then be formed on the insulating layer 152, the thickness of the UBM layer being sufficient to fill the remainder of the connection holes 151. The conductive plugs 156 may be formed in the connection holes 151 using a masking pattern (not shown). The masking pattern may also be configured to allow for some additional modification of the active surface beyond the immediate vicinity of the conductive plugs 156 during which a portion of the insulating layer 152 and UBM layer 153 exposed by the masking pattern may be removed.

Figure 24:
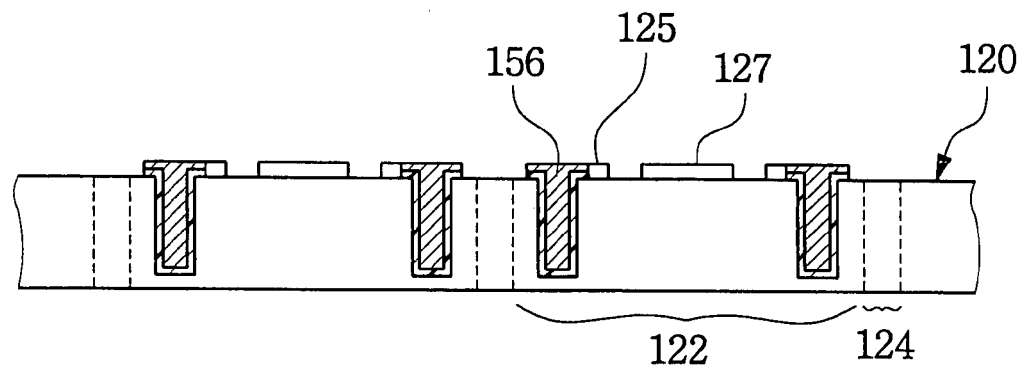

As illustrated in FIG. 24, chip pads 125 and a microlens 127 may be formed on the active surface 123 of the silicon substrate 121 using conventional semiconductor device fabrication processes. The chip pads 125 may be connected to the conductive plugs 156. The microlens 127 may be located in a more central region of the image sensor chip, typically between the chip pads 125. Generally, a silicon substrate that has passed through a semiconductor device fabrication process may be referred to simply as a wafer 120.

The conductive plugs 156 may be electrically connected to the chip pads 125 using redistribution lines. Alternatively, a wiring process may be performed so that the conductive plugs 156 may be electrically connected to the chip pads 125 during the steps of forming the chip pads 125.

Figure 25:
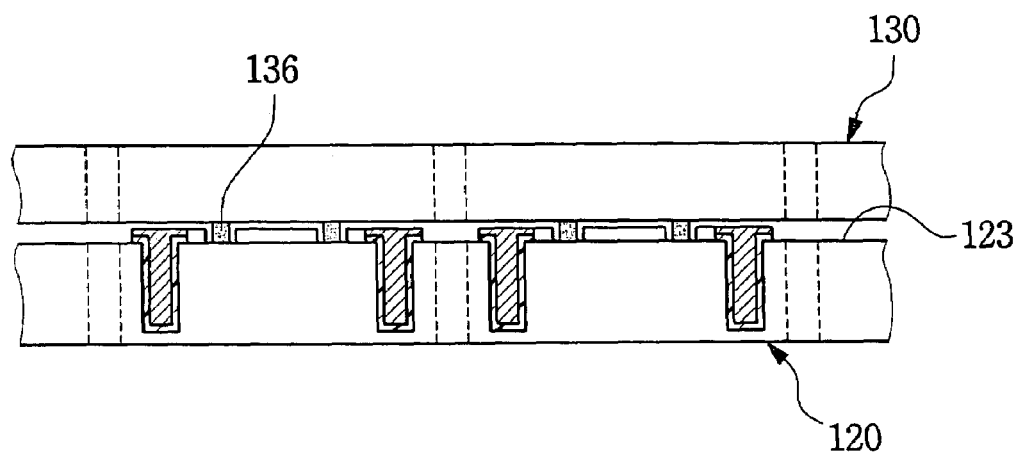

As illustrated in FIG. 25, the protective plate 130 may be attached to the active surface 123 of the wafer 120. For example, the protective plate 130 may be aligned on the active surface 123 of the wafer 120 and be attached thereto using the photosensitive adhesive patterns 136 provided on a surface of the protective layer. The protective plate 130 and the photosensitive adhesive patterns 136 may be applied to the wafer through a thermocompression method as generally detailed above. Because this basic processing sequence was described above and is similar, if not identical, to the corresponding steps of the first example embodiment, the detailed description is not necessary and has been omitted.

Figure 26:
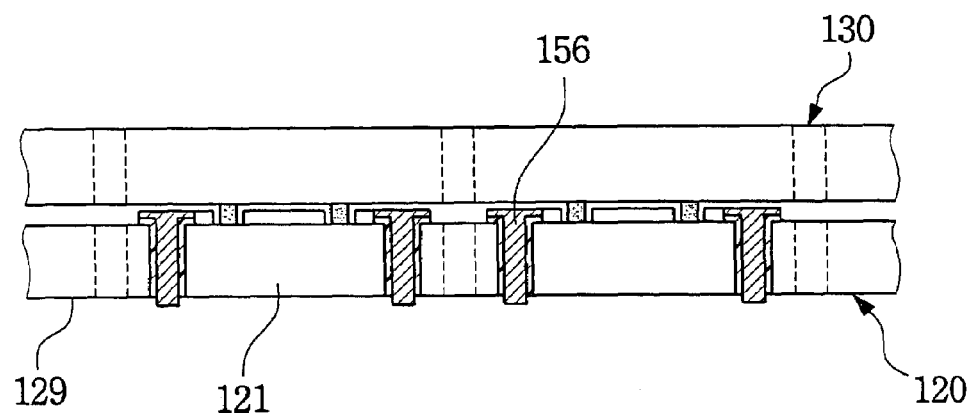

As illustrated in FIG. 26, a portion of the back surface 129 of the wafer 120 may then be removed. For example, a portion of the back surface 129 of the wafer 120 may be mechanically backlapped using a grinder to remove a portion of the original thickness sufficient to expose a lower portion of the conductive plugs 156. The silicon substrate 121 may be selectively removed using an etching solution having a high selection ratio, also referred to as selectivity, for the silicon substrate relative to the conductive plugs 156. Because an etch process is utilized rather than a mechanical process, e.g., backlapping, the exposed portion of the conductive plugs 156 may extend or protrude above a plane generally corresponding to the back surface 129 of the thinned wafer 120.

Figure 27:
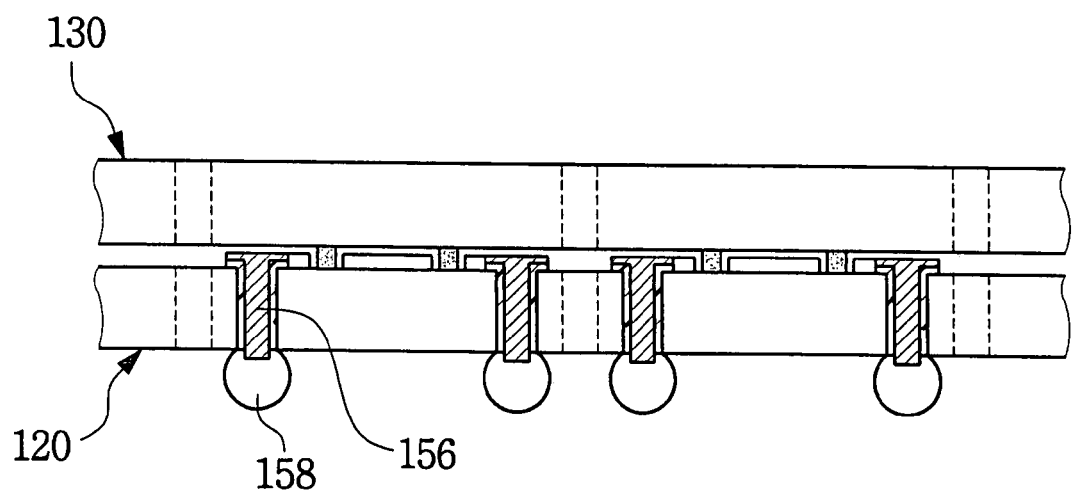
Figure 28:
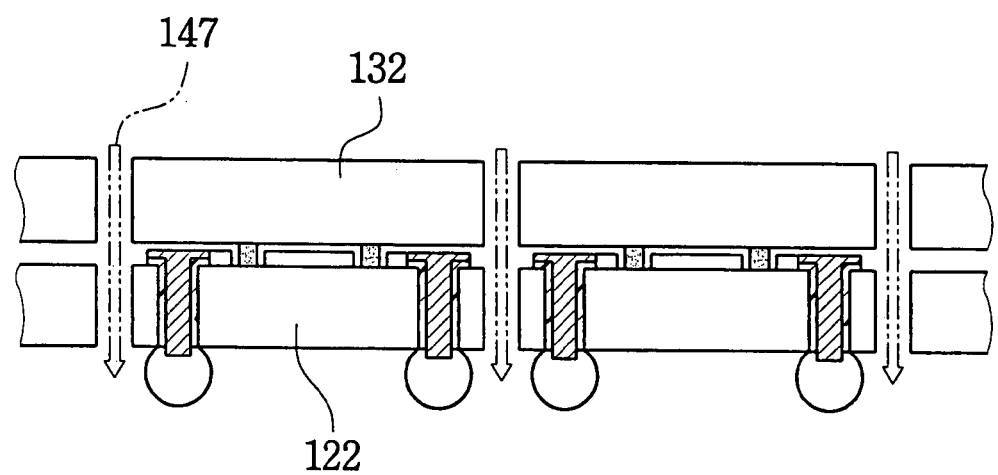

As illustrated in FIG. 27, solder balls 158 may be formed on the exposed portion of the conductive plugs 156. As illustrated in FIG. 28, the wafer 120 having the protective plate 130 attached may then be separated into individual image sensor chips 122. For example, the wafer 120 may be sawed along the scribe lines (124a of FIG. 21) using a sawing device 147 or subjected to another suitable technique for removing or embrittling those portions of the substrate between adjacent image sensor chips to allow the individual image sensor chips 122, each having a protective plate 132, to be separated from the wafer 120.

Example 2 may have a configuration similar to that of Example 1 in that the image sensor chip 122 may be electrically connected to the protective plate 130 through the chip pads 125, conductive plugs 156 and solder balls 158, except for using the silicon substrate 121. Therefore, the image sensor chip 122 of Example 2 may be expected to exhibit performance similar or substantially identical to that of the device of Example 1.

The conductive plugs 156 may be formed before forming the chip pads 125 and microlens 127. This may lead to a reduced likelihood for damage to the image sensor chip 122, resulting from the thermal, mechanical or electrical stresses which may occur during forming the conductive plugs 156 and subsequent processing.

In accordance with example embodiments, an image sensor chip may have a transparent protective plate for protecting a microlens from the external environment. The microlens may be prevented from being contaminated by fine particles during subsequent processes.

The protective plate may be attached to the image sensor chip using photosensitive adhesive patterns as an adhesive. The photosensitive adhesive patterns may be formed using a typical photolithography process. Therefore, a plurality of image sensor chips having each protective plates may be simultaneously obtained at wafer level, thereby allowing mass production image sensor chips having each protective plate.

Further, a flexible circuit substrate may be electrically connected to the image sensor chip through the chip pad, conductive plug and solder ball, thereby reducing an electrical connection path between the image sensor chip and the flexible circuit substrate.

OTHER CONFIGURATIONS

As will be appreciated by those skilled in the art, the various structural elements described above in connection with example embodiments may be reconfigured to produce additional image sensor chips without departing from the spirit and scope of the disclosure. For example, although the processes detailed above include forming an adhesive pattern on the protective plate, the adhesive pattern may be formed directly on the active surface of the semiconductor chip and subsequently attach the protective plate to the adhesive pattern. Similarly, a multilayer adhesive pattern may be formed from complementary adhesive patterns previously formed on both the active surface of the semiconductor chip and a surface of the protective plate. Depending on the precision with which the adhesive patterns can be formed, the complementary adhesive patterns may be configured to provide an interlocking function and/or different adhesive compositions for improved cure performance as the protective plate is attached to the semiconductor chip.

As will also be appreciated by those skilled in the art, the relative positions of the bonding pads and the adhesive pattern may also be modified to provide new image sensor configurations. For example, the processes detailed above illustrated attaching the adhesive pattern to an intermediate surface region of the active surface while the bonding pads are arranged and provided on a peripheral surface region of the active surface. In those instances, however, in which connection to the bonding pads will be made from the backside of the semiconductor chip as illustrated, e.g., in FIGS. 11-19, the relative positioning of the bonding pads and the adhesive pattern may be reversed whereby the bonding pads will be within the space defined between the inner surface of the protective plate, the active surface of the semiconductor chip and the inner sidewalls of the adhesive layer. In this manner, the bonding pads may be provided with improved protection from contamination and/or mechanical damage, improvements which may be expected to increase the reliability and/or operating life of the resulting image sensor.

Although example, non-limiting embodiments have been described in detail hereinabove, it should be understood that many variations and/or modifications of the basic inventive concepts herein taught, which may appear to those skilled in the art, will still fall within the spirit and scope of example embodiments as defined in the appended claims.

What is claimed is:

1. A method of manufacturing an image sensor device comprising:
   preparing a wafer having a plurality of image sensor chips formed on an active surface, wherein each image sensor chip includes chip pads formed in a peripheral region, a microlens formed in a central region and an intermediate region between the peripheral and central regions;
   preparing a protective plate having an adhesive pattern corresponding to the intermediate regions of the image sensor chips;
   attaching the protective plate to the active surface of the wafer with the adhesive pattern while maintaining a separation distance between the protective plate and the microlens;
   forming connection holes through the wafer from a back surface of the wafer to expose a portion of the lower surface of the chip pads;
   forming conductive plugs in the connection holes to establish electrical connections to the chip pads, the conductive plugs extending from the chip pads to the back surface of the wafer;
   forming solder balls on the back surface of the wafer and in electrical contact with the conductive plugs; and
   separating individual image sensor chips and corresponding individual protective plates from the wafer.

2. The method of manufacturing an image sensor device according to claim 1, wherein preparing the protective plate includes:
   forming a photosensitive adhesive layer on one surface of the protective plate;
   removing a portion of the photosensitive adhesive layer to form an adhesive pattern; and
   wherein attaching the protective plate includes;
   aligning the adhesive pattern with the intermediate regions of the image sensor chips and
   forcing the adhesive pattern against the intermediate regions while applying heat.

3. The method of manufacturing an image sensor device according to claim 2, wherein:
   forming the photosensitive adhesive layer includes a method selected from a group consisting of a spray method, a spin-on dispensing method, a vaporization method and a dry film attaching method.

4. The method of manufacturing an image sensor device according to claim 1, wherein forming the conductive plugs includes:
   forming an insulating layer on the back surface of the wafer and sidewalls of the connection holes;
   removing a portion of the insulating layer to expose the lower surface of the chip pads;
   forming an UBM layer on the insulating layer and the lower surface of the chip pads;
   forming a masking pattern on the UBM layer that exposes the connection holes;
   forming conductive plugs to fill the connection holes; and removing the masking pattern and a portion of the UBM layer under the masking pattern.

5. The method of manufacturing an image sensor device according to claim 1, wherein:
the protective plate is formed from glass or quartz.

6. A method of manufacturing an image sensor device comprising:
preparing a wafer having an active surface and a back surface opposite the active surface with chip areas and scribe lines formed between adjacent chip areas on the active surface;
forming connection holes extending from the active surface into the wafer;
forming conductive plugs in the connection holes;
forming chip pads in a peripheral region of the chip area, a microlens in a central region of the chip area and an intermediate region of the chip area between the peripheral and central regions;
attaching a protective plate to the intermediate regions of the chip area with an adhesive pattern while maintaining a separation distance between the protective plate and the microlens;
removing a portion of the back surface of the wafer to expose lower surfaces of the conductive plugs;
forming solder balls on the exposed lower surfaces of the conductive plugs; and
separating the wafer along the scribe lines into individual image sensor devices including corresponding individual protective plates.

7. The method of manufacturing an image sensor device according to claim 6, wherein forming the conductive plugs comprises:
forming an insulating layer on the active surface of the wafer and the connection holes;
forming a UBM layer on the insulating layer;
forming a masking pattern on the UBM layer that exposes the connection holes;
forming the conductive plugs to fill the connection holes; and
removing the masking pattern and a portion of the UBM and insulating layer under the masking pattern.

8. The method of manufacturing an image sensor device according to claim 6, wherein:
the conductive plugs are electrically connected to the chip pads using redistribution lines.

9. The method of manufacturing an image sensor device according to claim 6, wherein attaching a protective plate includes:
forming a photosensitive adhesive layer on one surface of the protective plate;
removing a portion of the photosensitive adhesive layer to form the adhesive pattern; and
aligning the adhesive pattern with the intermediate regions of the chip areas; and
attaching the protective plate to the wafer using a thermocompression method.

10. The method of manufacturing an image sensor device according to claim 9, wherein:
forming the photosensitive adhesive layer includes a method selected from a group consisting of a spray method, a spin-on dispensing method, a vaporization method and a dry film attaching method.

11. The method of manufacturing an image sensor device according to claim 9, wherein:
the photosensitive adhesive layer is formed from a photosensitive polymer.

12. The method of manufacturing an image sensor device according to claim 6, wherein:
the protective plate is formed from glass or quartz.

* * * * *